US007681302B2

(12) United States Patent
Kamigama

(10) Patent No.: US 7,681,302 B2
(45) Date of Patent: Mar. 23, 2010

(54) METHOD FOR MANUFACTURING A HARD DISK DRIVE ARM

(75) Inventor: Takehiro Kamigama, Kowloon (HK)

(73) Assignee: SAE Magnetics (H. K.) Ltd., Hong Kong (CN)

( * ) Notice: Subject to any disclaimer, the term of this patent is extended or adjusted under 35 U.S.C. 154(b) by 618 days.

(21) Appl. No.: 10/352,569

(22) Filed: Jan. 27, 2003

(65) Prior Publication Data

US 2004/0143959 A1 Jul. 29, 2004

(51) Int. Cl.
*G11B 5/127* (2006.01)
*G11B 5/60* (2006.01)

(52) U.S. Cl. .............. 29/603.03; 29/603.04; 29/603.06; 29/603.07; 29/603.12; 360/234.5

(58) Field of Classification Search .............. 29/603.04, 29/603.03, 603.12, 603.07, 840, 737, 417, 29/604.04; 360/123, 126, 235.7, 236.3, 234.6, 360/245.3, 234.5; 228/179.1, 179, 191, 180.22; 310/13
See application file for complete search history.

(56) References Cited

U.S. PATENT DOCUMENTS

| 4,761,609 A | * | 8/1988 | Dorman et al. ........ 324/207.13 |
| 4,761,699 A | * | 8/1988 | Ainslie et al. ............ 360/234.5 |
| 5,327,310 A | * | 7/1994 | Bischoff et al. .......... 360/237.1 |
| 5,530,604 A | * | 6/1996 | Pattanaik .................. 360/234.5 |
| 5,821,494 A | * | 10/1998 | Albrecht et al. ........ 219/121.64 |
| 5,856,896 A | * | 1/1999 | Berg et al. ................ 360/245.3 |
| 5,896,248 A | * | 4/1999 | Hanrahan et al. ......... 360/234.5 |
| 5,914,834 A | * | 6/1999 | Gustafson ................. 360/234.5 |
| 5,987,725 A | * | 11/1999 | Church et al. ............. 29/407.05 |
| 6,011,671 A | * | 1/2000 | Masse et al. ............. 360/245.4 |
| 6,085,406 A | * | 7/2000 | Garfunkel et al. ......... 29/603.14 |
| 6,245,188 B1 | * | 6/2001 | Toyoda et al. ................ 156/344 |
| 6,318,624 B1 | * | 11/2001 | Pattanaik et al. ............ 228/56.3 |
| 6,349,017 B1 | * | 2/2002 | Schott ....................... 360/234.6 |
| 2002/0133933 A1 | | 9/2002 | Erpelding et al. |
| 2003/0141349 A1 | * | 7/2003 | Liu et al. ................. 228/180.22 |

* cited by examiner

*Primary Examiner*—Derris H Banks
*Assistant Examiner*—Tai Nguyen
(74) *Attorney, Agent, or Firm*—Nixon & Vanderhye P.C.

(57) ABSTRACT

A system and method are disclosed for improving suspension-to-slider attachment in a hard disk drive. A slider having a number of bond pads on its leading edge and a number of bond pads on its trailing edge is to be coupled to a suspension flexure having a number of leading bond pads and a number of trailing bond pads. The slider is to be coupled to the suspension flexure at the leading bond pads and the trailing bond pads by a method such as gold ball, solder ball, or solder bump bonding.

12 Claims, 9 Drawing Sheets

METHOD FOR MANUFACTURING A HARD DISK DRIVE ARM

BACKGROUND INFORMATION

The present invention relates to hard disk drives. More specifically, the invention relates to a system and method for improving slider attachment.

FIG. 1 graphically illustrates a typical head-gimbal assembly (HGA) of a hard disk drive with disk media as used in the art. Hard disk drive storage devices typically include a rotating disk 9 containing concentric data tracks in which data is read from and written to by a slider 1 (containing a transducer head, not shown). The slider 1, which 'flies' close to the surface of the rotating disk 9, is typically attached to a load beam 8 by a suspension flexure 6. The slider (head) 1 is mounted to the flexure 6 by epoxy bonding 5 (See FIG. 2). The suspension flexure 6 allows the slider 1 to pitch and roll with respect to the disk 9 while the load beam 8 provides loading force (by spring action) towards the disk 9 during flight (countering the slider's lift).

Typically, the load beam 8 provides resilient spring action, which biases the slider towards the surface of the disk 9, while the flexure 6 provides pitch and roll flexibility for the slider as the slider rides on a cushion of air between the air bearing surface (slider 1 surface) and the rotating disk 9.

FIG. 2 provides a perspective view of a typical slider-suspension flexure assembly as used in the art. In a typical slider-suspension assembly, the slider 1 is epoxy-bonded to the suspension flexure 6, and the head's 1 transducer leads are electrically coupled to leads formed on the suspension flexure 6. The electrical connections 3 between the slider pads 2 and the flexure trace pads 4 are typically created by gold ball, solder ball, or solder bump bonding. The fabrication of such a slider suspension assembly is time consuming and costly.

FIG. 3 illustrates the attachment of a slider to a suspension flexure as typically performed in the art. Typically, a predetermined amount of epoxy 5 is placed on the tongue portion of the suspension flexure 6 where the slider 1 is to be located. The slider 1 is subsequently positioned onto the suspension flexure 6 with an alignment device, such as a vacuum tube 21. After the epoxy hardens to a degree, e.g. by ultra-violet (UV) light, electrical connections (such as by gold/solder ball or solder bump bonding) are made between the pads 2 of the slider head transducer and the suspension pads 4. The epoxy 5 is then further hardened by a method such as oven baking.

FIG. 4 provides a graphical illustration of a slider mounted upon a suspension flexure as is typical in the art. There are several disadvantages associated with the typical method of slider-suspension attachment. One problem involves the residual welding stress caused by the hardened epoxy 5 and soldered bump/gold ball 3 bonding. Typically in the art, it is difficult to apply the epoxy perfectly evenly, and as a result, the thick portion of the applied epoxy and the residual internal stress of the solder/gold ball bonding, cause changes in the slider 1 attitude angle and force the slider 1 to become askew with respect to the suspension flexure 6. (See also FIG. 5).

FIG. 5 illustrates a slider mounted askew with respect to a suspension flexure as is common in the art. The pitch 22 attitude angle of the slider 1 may seriously degrade while the epoxy 5 is curing.

It is therefore desirable to have a simplified system and method for manufacturing a hard disk drive slider-suspension assembly that avoids the above-mentioned problems, as well as having additional benefits.

BRIEF DESCRIPTION THE DRAWINGS

FIG. 1 illustrates a typical head-gimbal assembly (HGA) as used in the art.

FIG. 2 provides a perspective view of a typical slider-suspension flexure assembly as used in the art.

FIG. 3 illustrates the attachment of a slider to a suspension flexure as typically performed in the art.

FIG. 4 provides a graphical illustration of a slider mounted upon a suspension flexure as is typical in the art.

Figure 8:
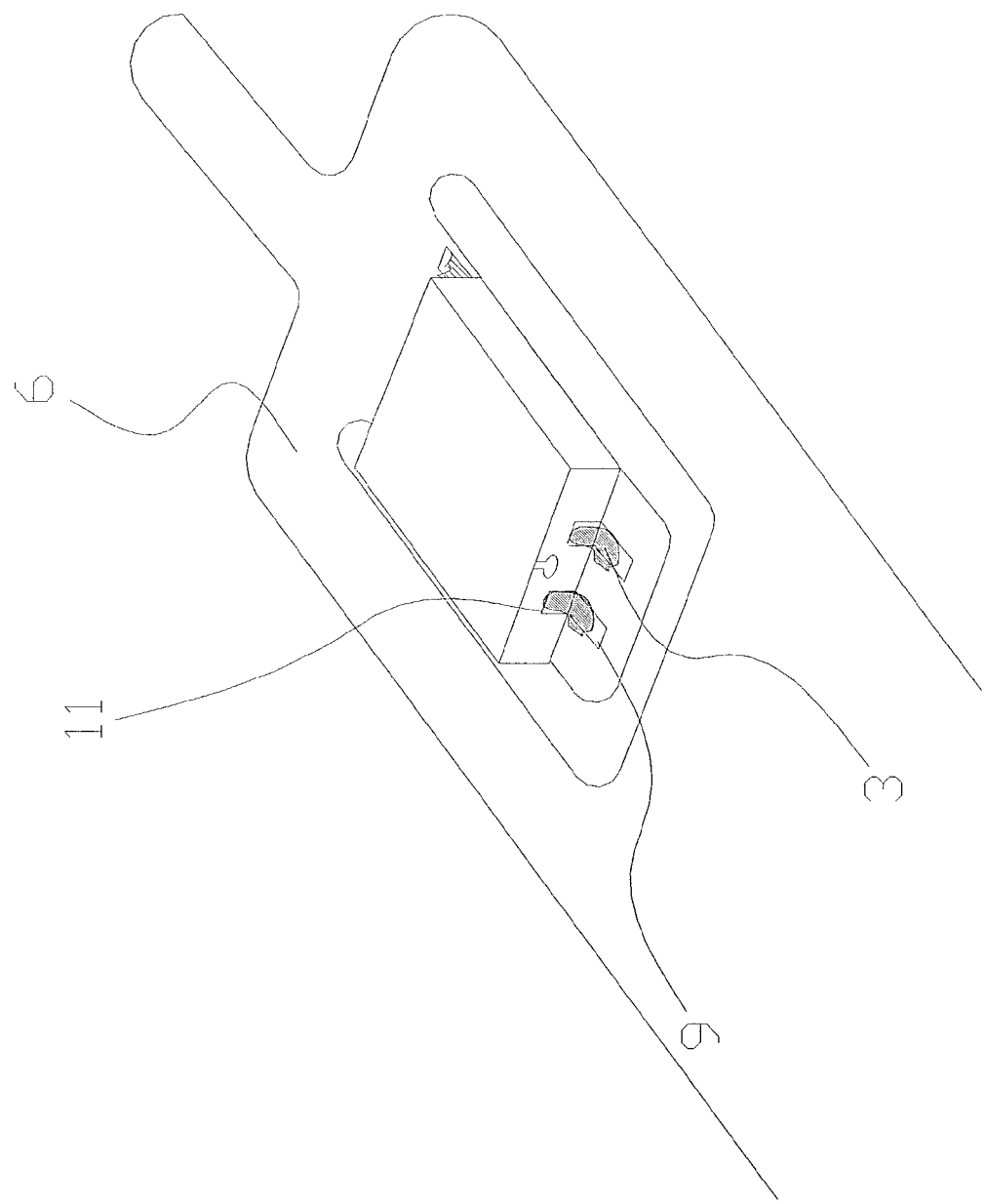

FIG. 8 provides a perspective view of a slider attached to a suspension flexure according to an embodiment of the present invention.

Figure 9:
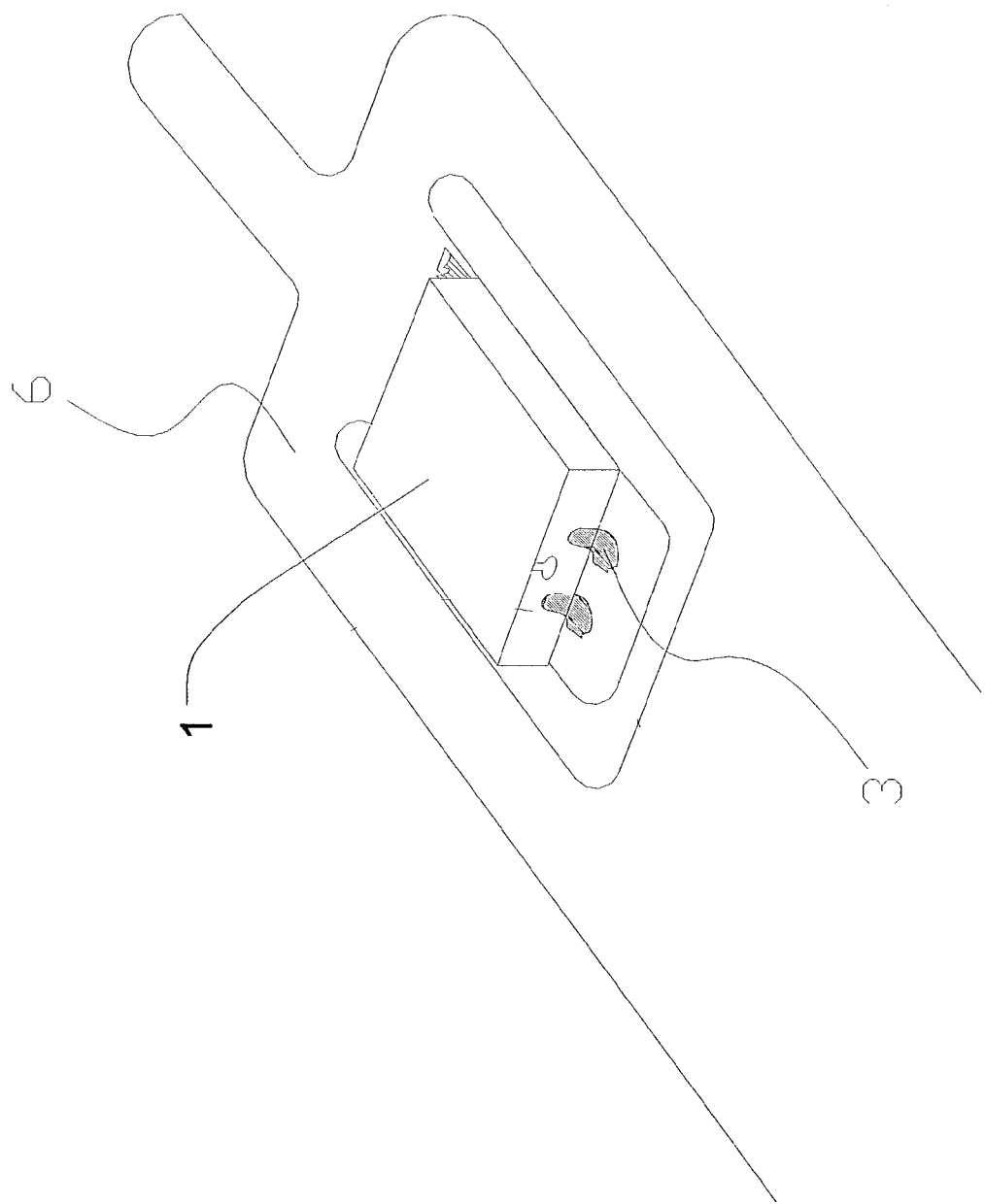

FIG. 9 provides a perspective view of a slider attached to a suspension flexure according to an alternative embodiment of the present invention.

DETAILED DESCRIPTION

Figure 1:
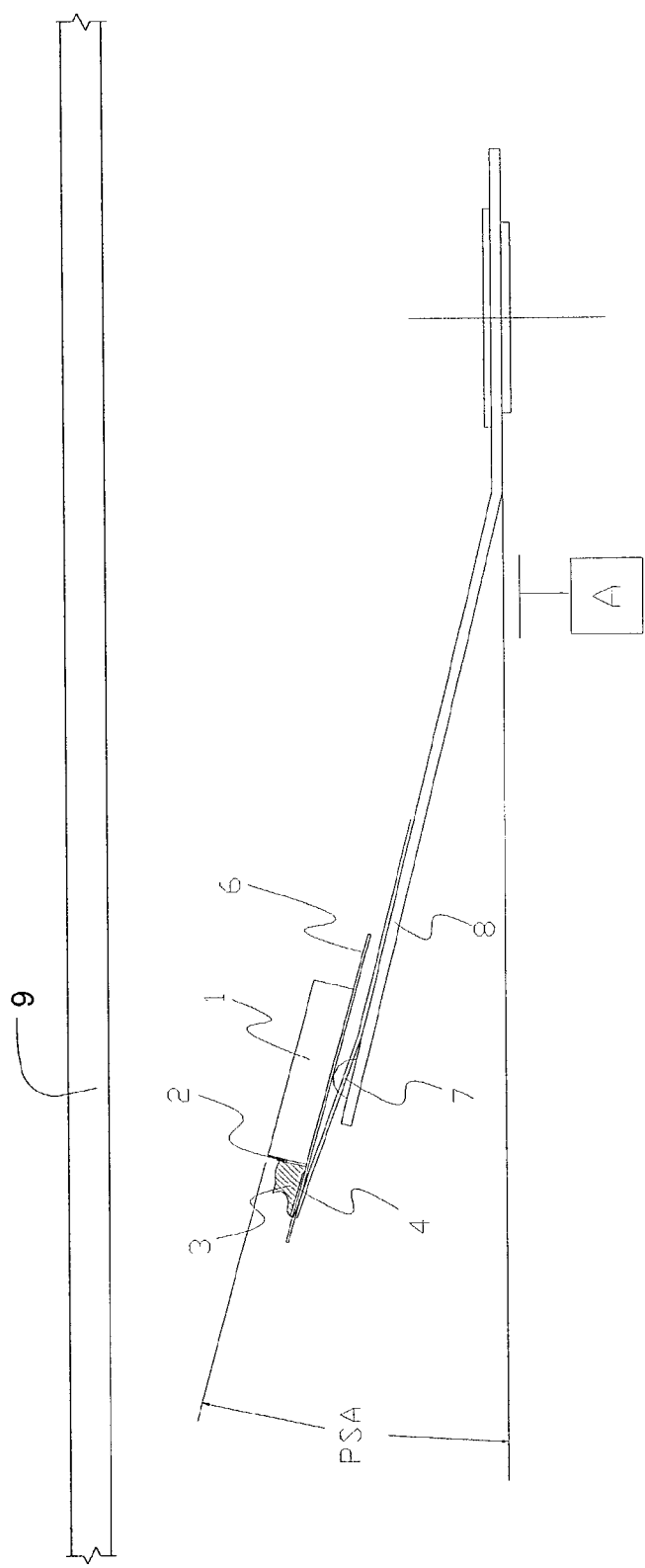
Figure 2:
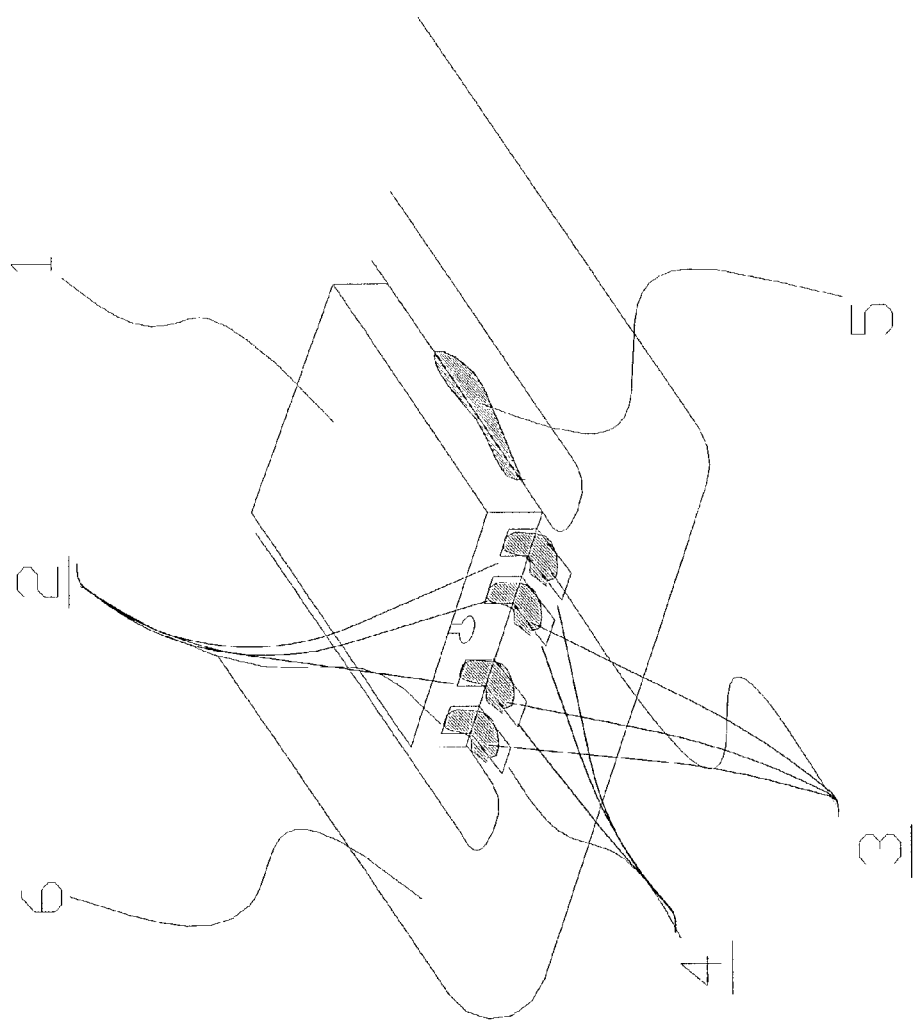
Figure 3:
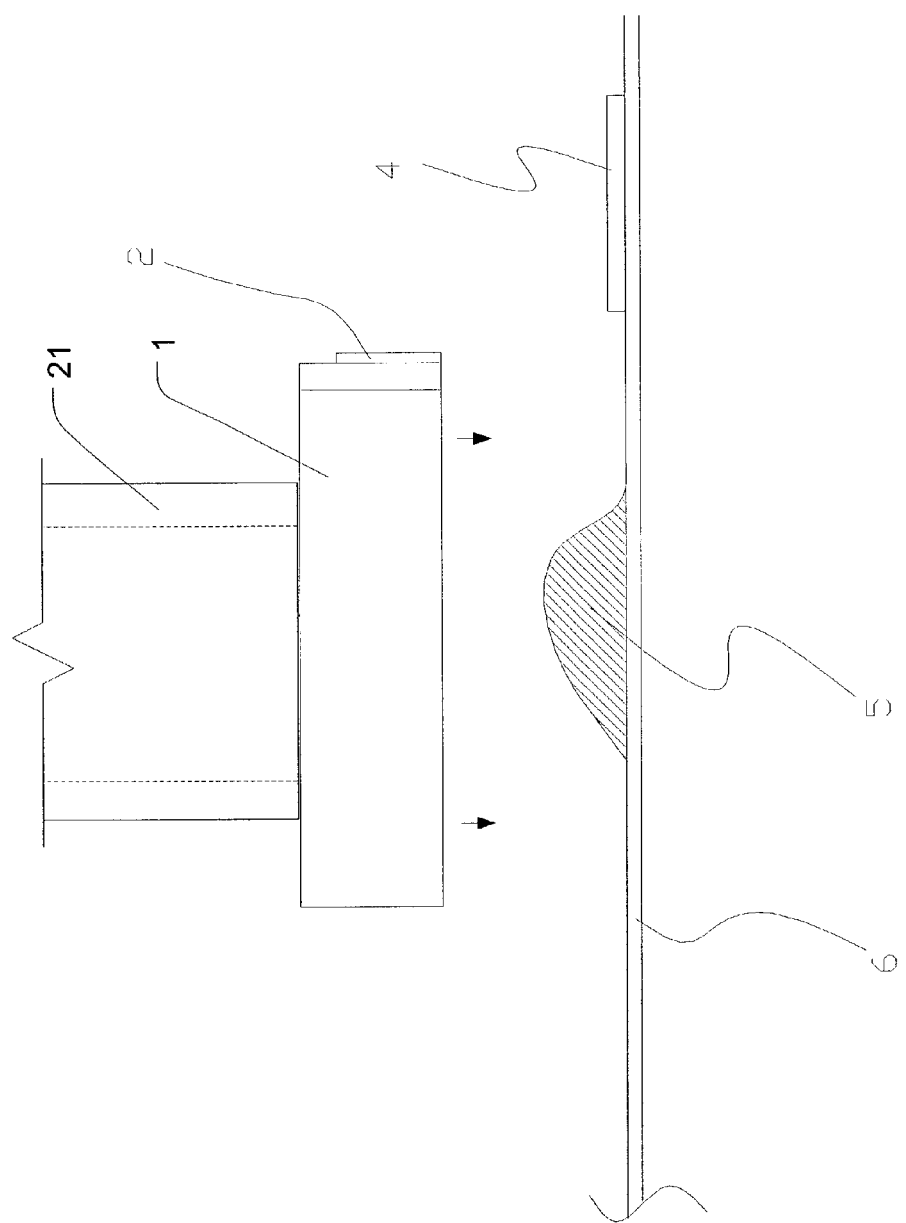
Figure 4:
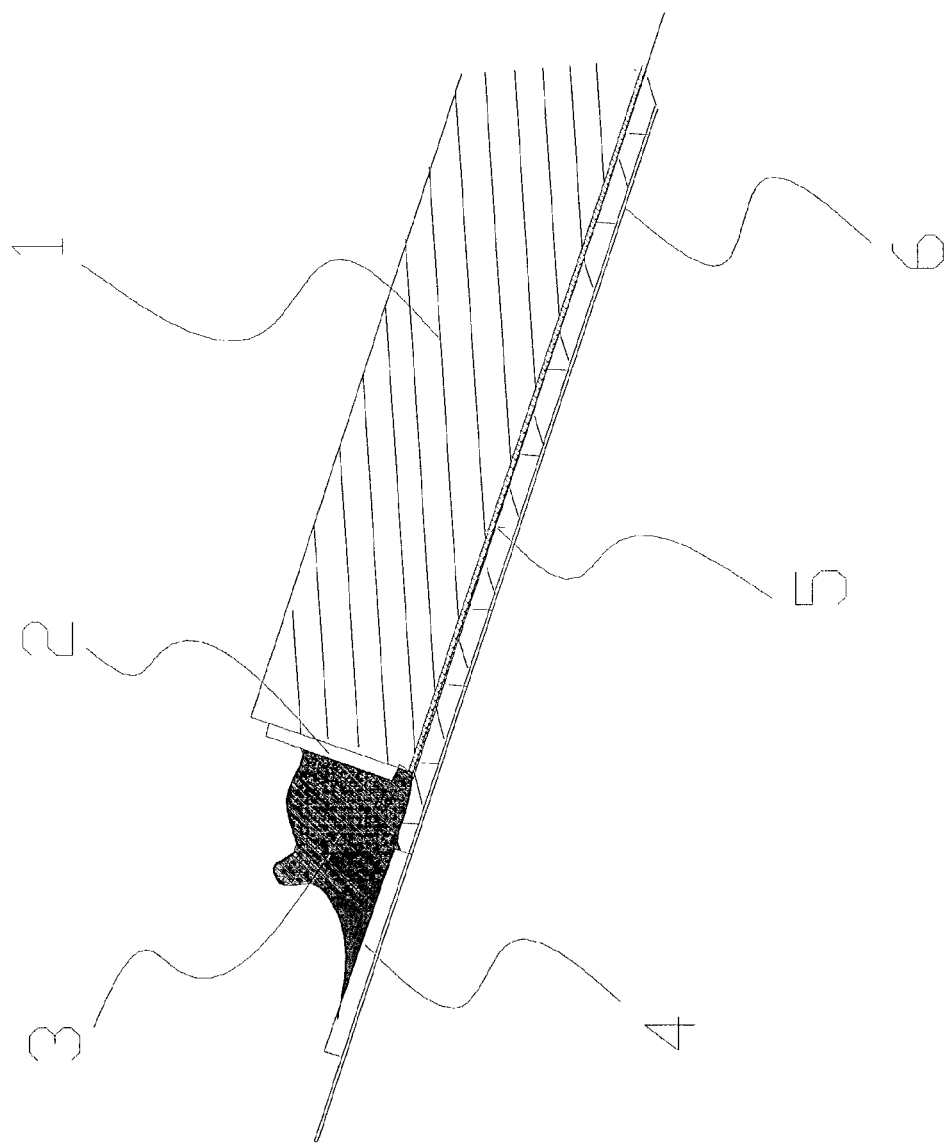
Figure 5:
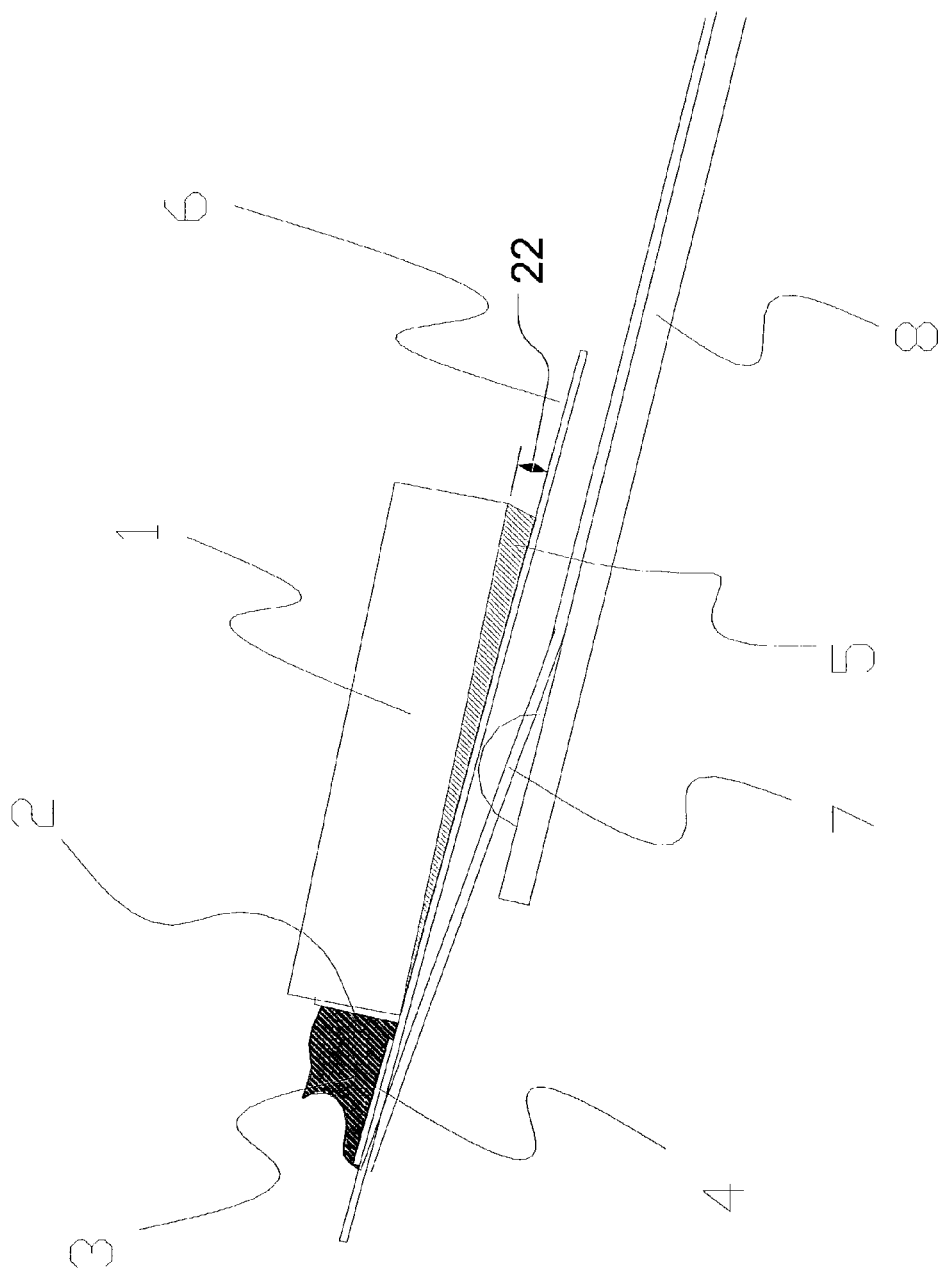
FIG. 5 illustrates a slider mounted askew with respect to a suspension flexure as is common in the art.
Figure 6:
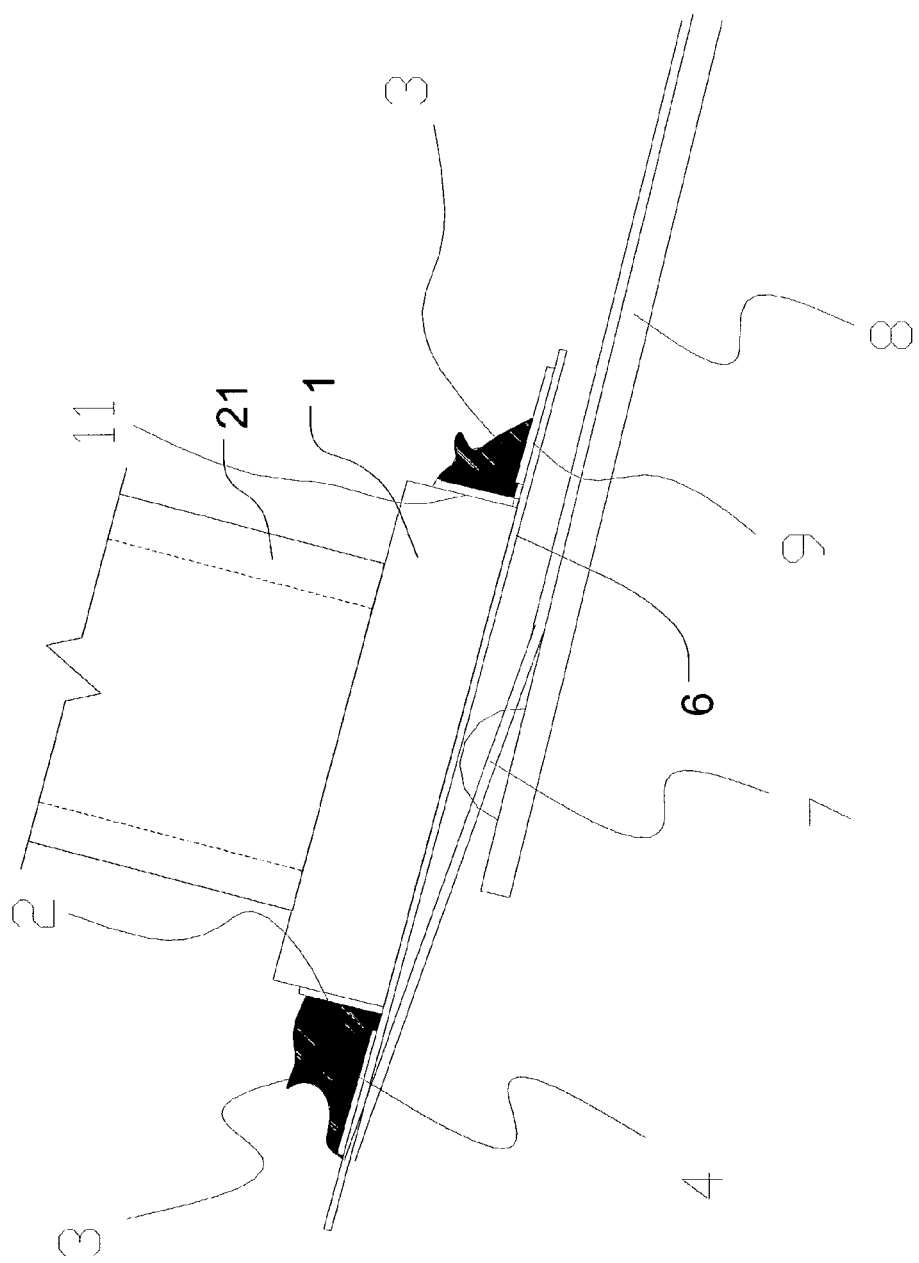
FIG. 6 illustrates the attachment of slider to suspension according to an embodiment of the present invention.

FIG. 6 illustrates slider-suspension attachment according to an embodiment of the present invention. In one embodiment, the slider 1 is mounted to the suspension flexure 6 by a simplified process. In this embodiment, improved Pitch Static Attitude ("RSA") and Roll Static Attitude ("RSA") are achieved by bonding (such as by gold ball, solder ball, or solder bump) the slider 1 to the suspension flexure 6 at the leading edge and the trailing edge. In addition to a more stable bond (reduced likelihood of shifting out of alignment), the process is simplified and less expensive as compared to the prior art. Because epoxy is not utilized, the tooling necessary is reduced.

In one embodiment of the present invention, transducer electrical bonding pads 2 of the slider 1 are coupled by a method such as gold ball, solder ball, or solder bump bonding to electrical bonding pads 4 of the suspension flexure 6. In addition, in this embodiment grounding bonding pads 11 of the slider 1 are coupled by a method such as gold ball, solder ball, or solder bump bonding to corresponding grounding bonding pads 9 of the suspension flexure 6. By utilizing bonds 3 at the leading edge and the trailing edge of the slider 1, the need for epoxy is eliminated. Further, in this embodiment the utilization of the grounding pad 11,9 coupling reduces the likelihood of damage to the slider 1 transducer head caused by Electro-Static Discharge (ESD).

In one embodiment, a placement device 21 is utilized to position (e.g., by vacuum tube) the slider 1 upon the suspension flexure 6 for the pads 2,4,9,11 to be bonded 3 by a method such as gold ball, solder ball, or solder bump bonding. Once the bonding 3 has cooled and hardened, in this embodiment the placement device 21 releases the slider 1, and the slider 1 remains attached to the suspension flexure 6 in the appropriate orientation.

Figure 7:
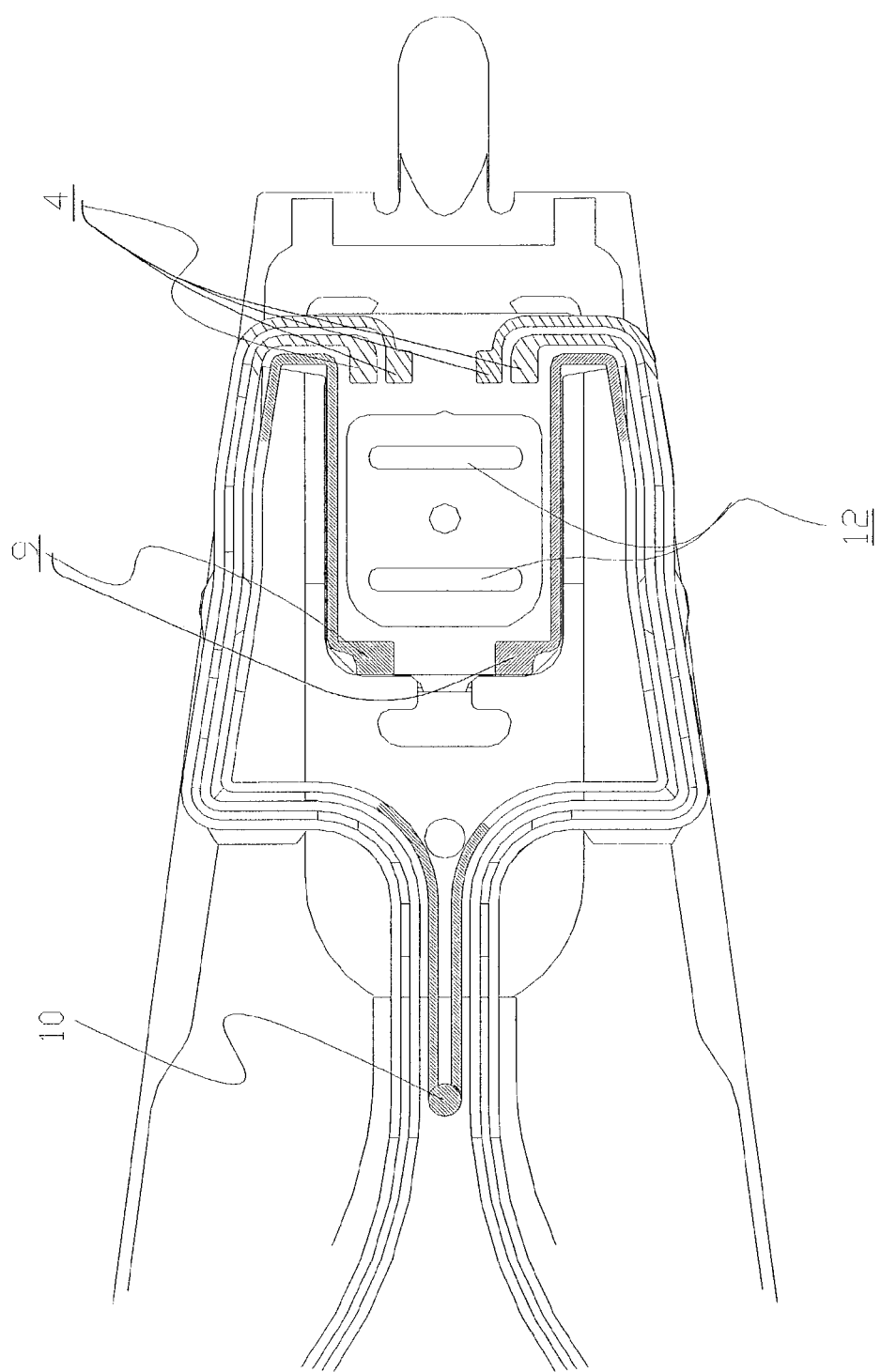
FIG. 7 illustrates a suspension flexure with suspension and circuitry according to an embodiment of the present invention.

FIG. 7 illustrates a suspension flexure with circuitry according to an embodiment of the present invention. In one embodiment, four transducer electrical pads 4 and two grounding pads 9 are utilized. In one embodiment, two slots 12 are utilized for relieving any residual stress created in the flexure from slider assembly.

FIG. 8 provides a perspective view of a slider attached to a suspension flexure according to an embodiment of the present invention.

FIG. 9 provides a perspective view of a slider attached to a suspension flexure according to an alternative embodiment of the present invention. In this alternative embodiment of the present invention, the slider 1 is bonded to the suspension flexure 6 at the trailing edge, such as by gold ball, solder ball, or solder bump bonding, without bonding pads (i.e, for physical coupling only, not for electrical grounding). In another alternative embodiment, the slider is bonded to the suspension flexure at the leading edge without bonding pads (not shown).

Although several embodiments are specifically illustrated and described herein, it will be appreciated that modifications and variations of the present invention are covered by the above teachings and within the purview of the appended claims without departing from the spirit and intended scope of the invention.

The invention claimed is:

1. A method for manufacturing a hard disk drive arm comprising:
   providing a slider element having a number of slider electrical pads on a leading edge of the slider element and a number of slider electrical pads on a trailing edge of the slider element;
   providing a hard drive arm suspension element having a number of leading suspension electrical pads, each electrically coupled to a trace element, and a number of trailing suspension electrical pads on a surface of the hard drive arm suspension element; and
   coupling said slider element to said hard drive arm suspension element at said leading electrical pads and said trailing electrical pads.

2. The method of claim 1, further comprising positioning said slider element onto said suspension element by a placement device for said coupling said slider element to said suspension element.

3. The method of claim 1, wherein said slider element includes a magneto-resistive (MR) transducer head element.

4. The method of claim 3, wherein said suspension element is a hard drive arm suspension flexure.

5. The method of claim 4, wherein said coupling is by gold ball bonding.

6. The method of claim 4, wherein said coupling is by solder ball bonding.

7. The method of claim 4, wherein said coupling is by solder bump bonding.

8. The method of claim 4, wherein said leading edge slider electrical pads and said leading suspension electrical pads are grounding pads.

9. The method of claim 4, wherein said number of leading edge slider electrical pads is two, and said number of leading suspension electrical pads is two.

10. The method of claim 4, wherein said trailing edge slider electrical pads and said trailing suspension electrical pads are transducer pads.

11. The method of claim 4, wherein said number of trailing edge slider electrical pads is four, and said number of trailing suspension electrical pads is four.

12. A method for manufacturing a hard disk drive arm comprising:
   providing a slider element having a number of slider electrical pads on a leading edge of the slider element and a number of slider electrical pads on a trailing edge of the slider element;
   providing a hard drive arm suspension element having a number of leading suspension electrical pads, each electrically coupled to a trace element, and a number of trailing suspension electrical pads on a surface of the hard drive arm suspension element; and
   coupling said slider element to said hard drive arm suspension element at said leading electrical pads and said trailing electrical pads and further comprising positioning said slider element onto said suspension element by a placement device for said coupling said slider element to said suspension element wherein said placement device is a vacuum tube.

\* \* \* \* \*